United States Patent
Cheng

(10) Patent No.: US 10,998,076 B1
(45) Date of Patent: May 4, 2021

(54) SIGNAL CALIBRATION METHOD USED IN MEMORY APPARATUS

(71) Applicant: Realtek Semiconductor Corporation, Hsinchu (TW)

(72) Inventor: Ching-Sheng Cheng, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 52 days.

(21) Appl. No.: 16/671,362

(22) Filed: Nov. 1, 2019

(51) Int. Cl.
| | |
|---|---|
| G11C 29/38 | (2006.01) |
| G06F 3/06 | (2006.01) |
| G11C 29/12 | (2006.01) |
| G11C 11/406 | (2006.01) |
| G06F 1/14 | (2006.01) |
| G11C 5/14 | (2006.01) |
| G11C 11/4096 | (2006.01) |

(52) U.S. Cl.
CPC ............... *G11C 29/38* (2013.01); *G06F 1/14* (2013.01); *G06F 3/0625* (2013.01); *G06F 3/0634* (2013.01); *G06F 3/0659* (2013.01); *G11C 5/14* (2013.01); *G11C 5/144* (2013.01); *G11C 11/40615* (2013.01); *G11C 29/12015* (2013.01); *G11C 11/4096* (2013.01); *G11C 2211/4067* (2013.01)

(58) Field of Classification Search
CPC .............. G11C 29/38; G11C 29/12015; G11C 11/4096; G11C 5/14; G11C 5/144; G11C 11/40615; G11C 2211/4067; G06F 3/0625; G06F 1/14; G06F 3/0659; G06F 3/0634
USPC ..... 714/718, 719, 731; 365/222, 227, 233.1, 365/233.13, 233.15, 233.5
See application file for complete search history.

(56) References Cited

U.S. PATENT DOCUMENTS

| | | | | |
|---|---|---|---|---|
| 6,195,306 B1* | 2/2001 | Horiguchi | ............... | G11C 5/063 365/226 |
| 6,580,659 B1* | 6/2003 | Roohparvar | ......... | G11C 7/1018 365/185.23 |
| 9,142,280 B1* | 9/2015 | Pandey | ............... | G11C 11/4094 |
| 9,606,742 B1* | 3/2017 | Cho | ....................... | G06F 1/3275 |
| 2002/0015328 A1* | 2/2002 | Dono | ................. | G11C 16/0441 365/185.08 |

(Continued)

OTHER PUBLICATIONS

Chandrasekar et al., Improved Power Modeling of DDR SDRAMs, 2011, IEEE, pp. 99-108. (Year: 2011).*

*Primary Examiner* — John J Tabone, Jr.
(74) *Attorney, Agent, or Firm* — Locke Lord LLP; Tim Tingkang Xia, Esq.

(57) ABSTRACT

A signal calibration method that includes the steps outlined below is provided. A phase of an under-test signal generated by a memory controller is set to initiate a calibration process. A low-power status control command is issued by transmitting signals that include the under-test signal generated by the memory controller to a memory unit to switch the memory unit to a low power status, the low-power status control command forcing the under-test signal to toggle. A read command is issued by the memory controller to the memory unit for reading data. When the responded data does not match the predetermined data, the phase of the under-test signal is determined to be within a timing margin by the memory controller. When the responded data matches the predetermined data, the phase of the under-test signal is determined to be not within the timing margin by the memory controller.

11 Claims, 3 Drawing Sheets

(56) References Cited

U.S. PATENT DOCUMENTS

| | | | |
|---|---|---|---|
| 2002/0126561 A1* | 9/2002 | Roohparvar | G11C 5/14 365/226 |
| 2004/0042333 A1* | 3/2004 | Shore | G11C 11/406 365/236 |
| 2005/0157585 A1* | 7/2005 | Kato | G06F 13/4243 365/233.1 |
| 2007/0247951 A1* | 10/2007 | Kim | G11C 5/14 365/227 |
| 2009/0039941 A1* | 2/2009 | Chang | G06F 1/04 327/299 |
| 2013/0308406 A1* | 11/2013 | Park | H03K 17/22 365/222 |
| 2014/0181567 A1* | 6/2014 | Choi | G11C 11/4076 713/400 |
| 2019/0324686 A1* | 10/2019 | Matulik | G06F 3/0604 |
| 2020/0356290 A1* | 11/2020 | Choi | G06F 3/0634 |
| 2021/0020224 A1* | 1/2021 | Cox | G11C 11/4076 |

* cited by examiner

SIGNAL CALIBRATION METHOD USED IN MEMORY APPARATUS

BACKGROUND

Field of Invention

The present invention relates to a memory technology. More particularly, the present invention relates to a signal calibration method capable for use with a memory apparatus.

Description of Related Art

In memory standard, e.g. the double data rate (DDR) memory, a power-down command or a self-refresh command can switch the memory to a low power status. In practical implementations, the power-down command and the self-refresh command are issued by transmitting a plurality of signals that includes a clock enable signal that actually switches the memory to the low power status.

However, when the clock enable signal is required to be calibrated, it can be difficult to measure the timing margin by using the signals in the memory, since the memory is switched to the low power status after receiving the power-down command or the self-refresh command.

Accordingly, a signal calibration method capable for use with a memory apparatus is desired for addressing the issues mentioned above.

SUMMARY

An aspect of the present invention is to provide a signal calibration method capable for use with a memory apparatus that includes the steps outlined below. A phase of an under-test signal generated by a memory controller in the memory apparatus is set to initiate a calibration process. A low-power status control command is issued by transmitting a plurality of signals that include the under-test signal generated by the memory controller to a memory unit in the memory apparatus to switch the memory unit to a low power status, the low-power status control command forcing the under-test signal to toggle. A read command is issued by the memory controller to the memory unit for reading data to be responded from the memory unit. When the responded data does not match the predetermined data, the phase of the under-test signal is determined to be within a timing margin by the memory controller. When the responded data matches the predetermined data, the phase of the under-test signal is determined to be not within the timing margin by the memory controller.

Another aspect of the present invention is to provide a signal calibration method capable for use with a memory apparatus that includes the steps outlined below. An under-test signal that is periodic is generated by a memory controller in the memory apparatus, wherein each time period of the under-test signal includes a first state and a second state, the time period of the under-test signal being equivalent to the time period of an operation clock of a memory unit in the memory apparatus. A control command is issued by transmitting a plurality of signals that include the under-test signal generated by the memory controller to the memory unit to control the memory unit such that the operation clock of the memory unit samples the first state of the under-test signal without switching the memory unit to a low power status. A phase of the under-test signal is modified. A timing margin of the under-test signal is determined when the operation clock of the memory unit samples the second state of the under-test signal such that the memory unit is switched to the low power status.

These and other features, aspects, and advantages of the present invention will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
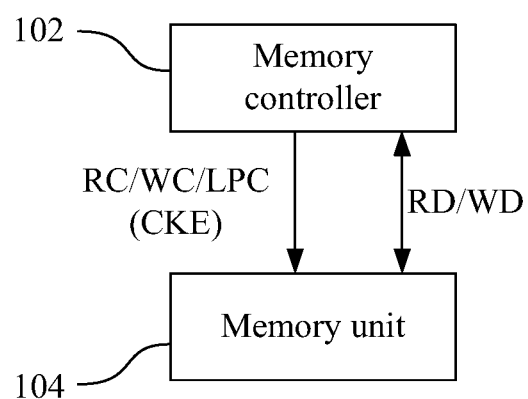
FIG. 1 is a block diagram of an electronic system in an embodiment of the present invention.

Reference will now be made in detail to the present embodiments of the disclosure, examples of which are illustrated in the accompanying drawings. Wherever possible, the same reference numbers are used in the drawings and the description to refer to the same or like parts.

Reference is made to FIG. 1. FIG. 1 is a block diagram of a memory apparatus 100 in an embodiment of the present invention.

The memory apparatus 100 is configured to store data. Further, in an embodiment, the memory apparatus 100 can be disposed in an electronic system such that the memory apparatus 100 is accessed by other modules in the electronic system.

The memory apparatus 100 includes a memory controller 102 and a memory unit 104.

The memory controller 102 and the memory unit 104 can be either formed in a single package or in different packages independent from each other. The memory controller 102 is electrically coupled to the memory unit 104.

The memory controller 102 is configured to access the memory unit 104 by issuing commands to the memory unit 104. The memory unit 104 is configured to store data therein. In an embodiment, the memory unit 104 can be such as, but not limited to a double data rate (DDR) memory.

In an embodiment, the memory controller 102 can perform such as, but not limited to read operation on the memory unit 104 under the request from an external module (not illustrated) such that the memory controller 102 issues a read command RC to the memory unit 104 to read data RD from the memory unit 104 and transmit the data RD to the external module.

In another embodiment, the memory controller 102 can also perform such as, but not limited to write operation on the memory unit 104 under the request from an external module such that the memory controller 102 issues a write command WC and transmits data WD from the external module to the memory unit 104 so that the memory unit 104 stores the data WD.

Further, the memory controller 102 may also switch the memory unit 104 to a low-power status under the request from an external module by issuing a low-power status control command LPC to the memory unit 104 such that the memory unit 104 switches to a low-power status that consumes less power than the normal operation status. In an embodiment, the low-power status control command LPC can be a power-down command that switches the memory unit 104 to the low-power status without keeping data or a self-refresh command that switches the memory unit 104 to the low-power status while the data stored in the memory unit 104 is kept.

It is appreciated that the operations performed by the memory controller 102 on the memory unit 104 described above are merely an example. In other embodiments, the memory controller 102 may perform different operations on the memory unit 104.

In an embodiment, the commands issued by the memory controller 102, e.g. the read command RC, the write command WC and the low-power status control command LPC, can be implemented by transmitting a plurality of signals to the memory unit 104, in which a combination of the states of the signals correspond to a command.

In an embodiment, the signals include a clock enable signal CKE. When the low-power status control command LPC is issued, the clock enable signal CKE toggles. More specifically, when the low-power status control command LPC is issued, the clock enable signal CKE transits from a first state to a second state to switch the memory unit 104 to the low-power status. In an embodiment, the first state is a high state and the second state is a low state. However, the present invention is not limited thereto.

In an embodiment, once the low-power status control command LPC is issued, the memory unit 104 switches to the low-power status such that a timing margin of the clock enable signal CKE is not able to be determined due to the low-power status of the memory unit 104. The clock enable signal CKE thus cannot be calibrated by using the signals within the memory unit 104.

Figure 2:
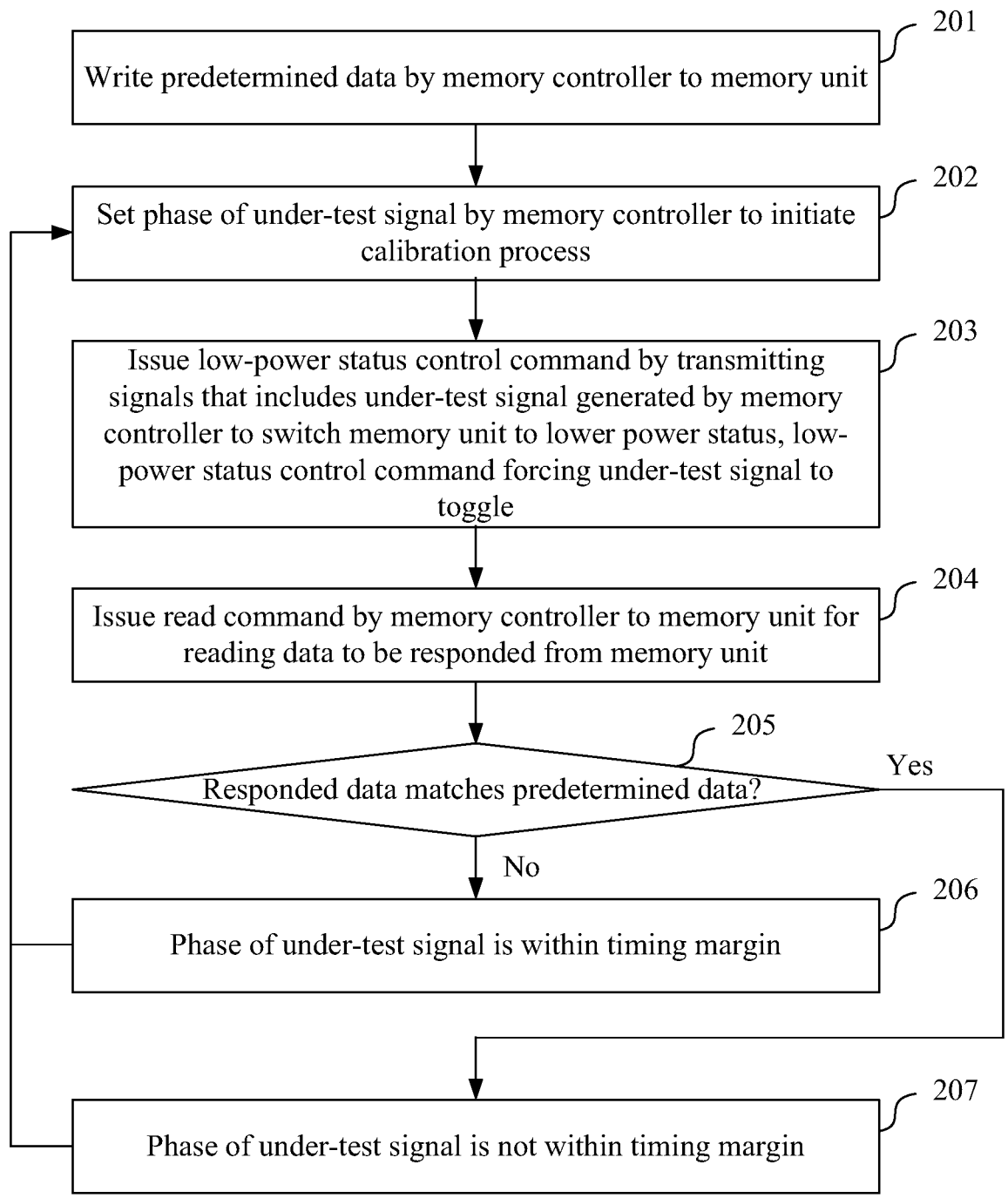
FIG. 2 is a flowchart of a signal calibration method in an embodiment of the present invention.

Reference is now made to FIG. 2. FIG. 2 is a flowchart of a signal calibration method 200 in an embodiment of the present invention. The signal calibration method 200 can be capable for use with the memory apparatus 100 illustrated in FIG. 1.

More specifically, the signal calibration method 200 is used to calibrate an under-test signal, which is the clock enable signal CKE in the present embodiment, generated by the memory controller 102 that is used to switch the memory unit 104 to the low-power status.

The signal calibration method 200 includes the steps outlined below (The steps are not recited in the sequence in which the steps are performed. That is, unless the sequence of the steps is expressly indicated, the sequence of the steps is interchangeable, and all or part of the steps may be simultaneously, partially simultaneously, or sequentially performed).

In step 201, predetermined data is written by the memory controller 102 to the memory unit 104.

In an embodiment, the memory controller 102 can issue the write command WC to write the predetermined data to the memory unit 104.

In step 202, the phase of the under-test signal, i.e. the clock enable signal CKE, generated by the memory controller 102 is set to initiate a calibration process.

In step 203, the low-power status control command LPC is issued by transmitting the signals that includes the under-test signal generated by the memory controller 102 to the memory unit 104 to switch the memory unit 104 to the low power status, the low-power status control command LPC forcing the under-test signal to toggle. In an embodiment, the under-test signal, i.e. the clock enable signal CKE, transits from the first state to the second state.

In step 204, the read command RC is issued by the memory controller 102 to the memory unit 104 for reading data to be responded from the memory unit 104.

In step 205, whether the responded data matches the predetermined data is determined.

In step 206, when the responded data does not match the predetermined data, the phase of the under-test signal is determined by the memory controller 102 to be within a timing margin.

Since the low-power status control command LPC is supposed to switch the memory unit 104 to the low power status, the memory unit 104 is not able to respond the correct data (i.e. the predetermined data) to the memory controller 102 according to the read command RC issued after the low-power status control command LPC.

As a result, when the responded data does not match the predetermined data, the memory unit 104 is determined to be switched to the low power status. The current phase of the under-test signal, i.e. the clock enable signal CKE, is determined to be within the timing margin.

On the contrary, in step 207, when the responded data matches the predetermined data, the phase of the under-test signal is determined by the memory controller 102 to be not within the timing margin.

As described above, since the low-power status control command LPC is supposed to switch the memory unit 104 to the low power status, the memory unit 104 is not able to respond the correct data (i.e. the predetermined data) to the memory controller 102 according to the read command RC issued after the low-power status control command LPC.

As a result, when the responded data matches the predetermined data, the memory unit 104 is determined to be not switched to the low power status. More specifically, the memory unit 104 fails to be switched to the low power status and is still in the operation status. The current phase of the under-test signal, i.e. the clock enable signal CKE, is determined to be not within the timing margin.

When either the phase of the under-test signal is determined to be within the timing margin in step 206 or is determined to be not within the timing margin in step 207, the flow goes back to step 202, in which a new phase of the under-test signal is set by the memory controller 102 to initiate another calibration process.

By repeating the flow described above with a new phase in each of a plurality of iterations, the timing margin of the under-test signal, i.e. the clock enable signal CKE, can be determined.

Figure 3:
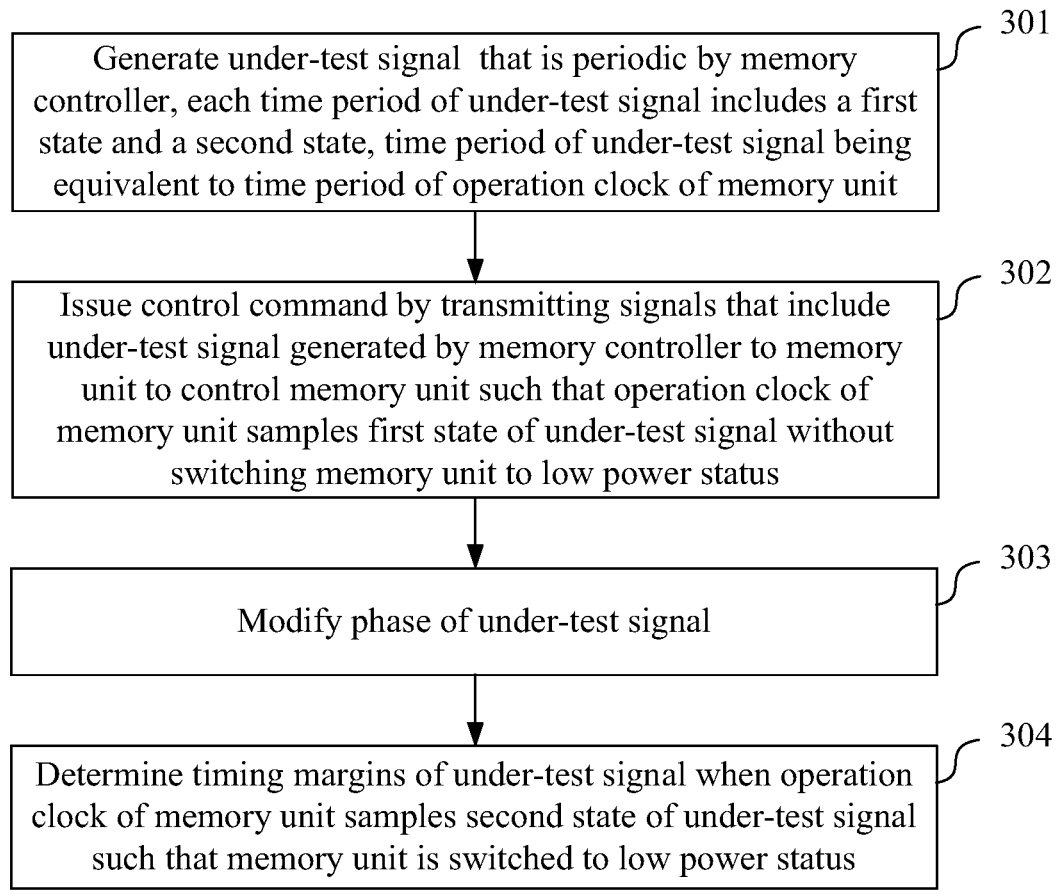
FIG. 3 is a flowchart of a signal calibration method in an embodiment of the present invention.

Reference is now made to FIG. 3. FIG. 3 is a flowchart of a signal calibration method 300 in an embodiment of the present invention. The signal calibration method 300 can be capable for use with the memory apparatus 100 illustrated in FIG. 1.

More specifically, the signal calibration method 300 is used to calibrate an under-test signal, which is the clock enable signal CKE in the present embodiment, generated by the memory controller 102 that is used to switch the memory unit 104 to the low-power status.

The signal calibration method 300 includes the steps outlined below (The steps are not recited in the sequence in which the steps are performed. That is, unless the sequence of the steps is expressly indicated, the sequence of the steps is interchangeable, and all or part of the steps may be simultaneously, partially simultaneously, or sequentially performed).

In step 301, an under-test signal that is periodic, i.e. the clock enable signal CKE, is generated by the memory controller 102, wherein each time period of the under-test signal includes a first state and a second state, the time period of the under-test signal being equivalent to the time period of an operation clock of the memory unit 104.

In step 302, a control command is issued by transmitting a plurality of signals that include the under-test signal generated by the memory controller 102 to the memory unit 104 to control the memory unit 104 such that the operation clock of the memory unit 106 samples the first state of the under-test signal without switching the memory unit 106 to the low power status.

Figure 4:
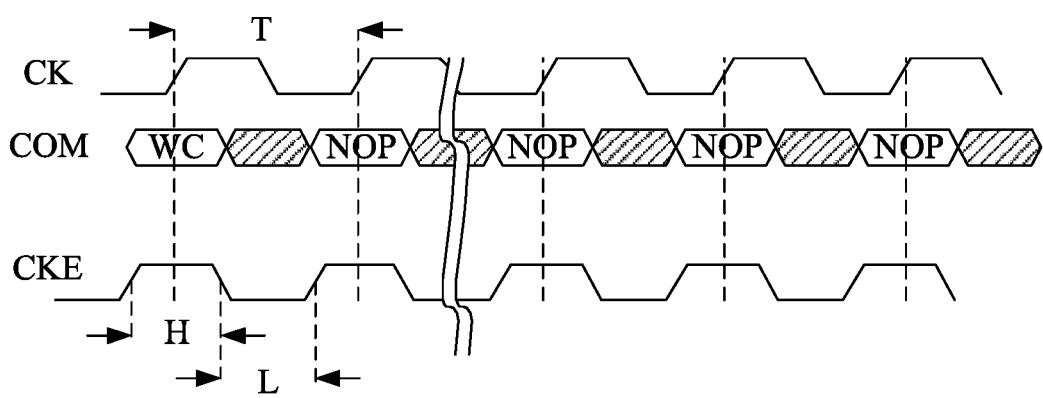
FIG. 4 is a diagram of the waveforms of the operation clock of the memory unit and the under-test signal in an embodiment of the present invention.

Reference is now made to FIG. 4. FIG. 4 is a diagram of the waveforms of the operation clock CK of the memory unit 104 and the under-test signal, i.e. the clock enable signal CKE, in an embodiment of the present invention.

In an embodiment, when a control command COM is issued by the memory controller 102 that does not switch the memory unit 104 to the low power status, e.g. a write command or a read command, an original clock enable signal CKE stays at the first state.

In an embodiment, a signal (not illustrated) that has the first state and the second state and has the time period being equivalent to the time period T of the operation clock CK can be superimposed upon the original clock enable signal CKE having only the first state in step 301 to form the clock enable signal CKE having the first state H and the second state L illustrated in FIG. 4.

In an embodiment, the first state H is the high state and the second state L is the low state. The duty cycle of the clock enable signal CKE having the first state H and the second state L can be any percentage or ratio as long as an edge is generated to determine the timing margin, and the duty cycle of 50% is exemplarily illustrated in FIG. 4.

In an embodiment, the first state H of the clock enable signal CKE is aligned to the sampling edge of the operation clock CK of the memory unit 106, in which in an embodiment, the sampling edge is the rising edge. More specifically, the sampling edge of the operation clock CK of the memory unit 106 only samples the first state H of the clock enable signal CKE without sampling the second state L of the clock enable signal CKE.

Under such a condition, when the control command COM is issued, though the waveform of the clock enable signal CKE is generated as a waveform having the high state and the low state, the memory unit 106 is still not switched to the low power status.

In step 303, a phase of the clock enable signal CKE is modified.

In step 304, a timing margin of the clock enable signal CKE is determined when the operation clock CK of the memory unit 104 samples the second state L of the clock enable signal CKE such that the memory unit 104 is switched to the low power status.

In an embodiment, the modification of the phase of the clock enable signal CKE can be performed in two ways. In one way, the phase of the clock enable signal CKE can be forwarded to determine a first timing margin of the clock enable signal CKE when the operation clock CK of the memory unit 104 samples the second state L of the clock enable signal CKE such that the memory unit 104 is switched to the low power status.

In another way, the phase of the clock enable signal CKE can be backwarded to determine a second timing margin of the clock enable signal CKE when the operation clock CK of the memory unit 104 samples the second state L of the clock enable signal CKE such that the memory unit 104 is switched to the low power status.

In an embodiment, though the durations of the first state H and the second state L are the same when the clock enable signal CKE is generated in the memory controller 102, the duration of the second state L may shrink when the clock enable signal CKE is received by the memory unit 104 due to the effect of the transmission channel of the clock enable signal CKE. As a result, by using the method described above, a timing margin of the clock enable signal CKE received by the memory unit 104 can be obtained.

The signal calibration method capable for use with the memory apparatus described above provides a mechanism to determine the timing margin of the under-test signal that switches the memory unit to the low power status. As a result, the timing margin of the under-test signal can still be measured even the memory unit is switched to the low power status. The under-test signal can thus be calibrated with greater accuracy.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A signal calibration method capable for use with a memory apparatus, comprising:
   setting a phase of an under-test signal generated by a memory controller in the memory apparatus to initiate a calibration process;
   issuing a low-power status control command by transmitting a plurality of signals that include the under-test signal generated by the memory controller to a memory unit in the memory apparatus to switch the memory unit to a low power status, the low-power status control command forcing the under-test signal to toggle;
   issuing a read command by the memory controller to the memory unit for reading data to be responded from the memory unit;
   when the responded data does not match a predetermined data, determining by the memory controller that the phase of the under-test signal is within a timing margin; and
   when the responded data matches the predetermined data, determining by the memory controller that the phase of the under-test signal is not within the timing margin.

2. The signal calibration method of claim 1, further comprising:
   setting a new phase of the under-test signal by the memory controller to initiate another calibration process.

3. The signal calibration method of claim 1, wherein the low-power status control command is power-down command or a self-refresh command.

4. The signal calibration method of claim 1, wherein before the step of setting the phase the under-test signal further comprising:
   writing the predetermined data by the memory controller to the memory unit so as to be read by the memory controller.

5. The signal calibration method of claim 1, wherein memory unit is a double data rate (DDR) memory.

6. The signal calibration method of claim 1, wherein the under-test signal is a clock enable signal.

7. A signal calibration method capable for use with a memory apparatus, comprising:
- generating an under-test signal that is periodic by a memory controller in the memory apparatus, wherein each time period of the under-test signal includes a first state and a second state, the time period of the under-test signal being equivalent to the time period of an operation clock of a memory unit in the memory apparatus;
- issuing a control command by transmitting a plurality of signals that include the under-test signal generated by the memory controller to the memory unit to control the memory unit, such that the operation clock of the memory unit samples the first state of the under-test signal without switching the memory unit to a low power status;
- modifying a phase of the under-test signal; and
- determining a timing margin of the under-test signal when the operation clock of the memory unit samples the second state of the under-test signal, such that the memory unit is switched to the low power status.

8. The signal calibration method of claim 7, further comprising:
- forwarding the phase of the under-test signal to determine a first timing margin of the under-test signal when the memory unit switches to the low power status by the second state of the under-test signal; and
- backwarding the phase of the under-test signal to determine a second timing margin of the under-test signal when the memory unit switches to the low power status by the second state of the under-test signal.

9. The signal calibration method of claim 7, further comprising:
- superimposing a signal that has the first state and the second state and that has the time period being equivalent to the time period of the operation clock upon an original under-test signal having only the first state.

10. The signal calibration method of claim 7, wherein memory unit is a double data rate memory.

11. The signal calibration method of claim 7, wherein the under-test signal is a clock enable signal.

\* \* \* \* \*